United States Patent [19]

Bridges et al.

[11] 4,453,802
[45] Jun. 12, 1984

[54] EVANESCENT-WAVE COUPLING DEVICE

[75] Inventors: William B. Bridges, Altadena; Adrian E. Popa, Newbury Park, both of Calif.

[73] Assignee: Hughes Aircraft Company, El Segundo, Calif.

[21] Appl. No.: 315,357

[22] Filed: Oct. 26, 1981

[51] Int. Cl.³ .................... G02B 5/172; H01P 1/00
[52] U.S. Cl. ................ 350/96.15; 250/227; 333/248; 350/96.14
[58] Field of Search ............. 350/96.13, 96.14, 96.15, 350/96.20; 250/227, 552, 553; 333/248, 250

[56] References Cited

U.S. PATENT DOCUMENTS

| | | | |
|---|---|---|---|
| 3,760,297 | 9/1973 | Thompson | 350/96.15 X |
| 3,916,351 | 10/1975 | Jacobs et al. | 350/96.13 X |
| 3,944,950 | 3/1976 | Jacobs et al. | 333/250 X |
| 4,270,224 | 5/1981 | Blondel et al. | 333/250 X |
| 4,293,833 | 10/1981 | Popa | 333/239 |
| 4,387,954 | 6/1983 | Beasley | 350/96.15 |
| 4,394,632 | 7/1983 | Hu | 333/250 X |

Primary Examiner—John D. Lee
Attorney, Agent, or Firm—A. W. Karambelas; W. J. Bethurum

[57] ABSTRACT

A dielectric waveguide is disposed adjacent to a diode array which allows for coupling of energy therebetween. The waveguide has a core section and a cladding section encompassing a core section except in a portion thereof. The diode array is disposed adjacent to the exposed core portion at a proximity which allows evanescent coupling of energy between energy traversing the waveguide and the diodes of the diode array. A variety of microwave devices may be provided by this arrangement which include a signal source, detector, harmonic generator, upconverter, down-converter, or power combiner, depending upon the types of signals and manner of application of the signals applied to the waveguide and to the diode array.

6 Claims, 10 Drawing Figures

EVANESCENT-WAVE COUPLING DEVICE

BACKGROUND OF THE INVENTION

The present invention relates generally to evanescent-wave coupling devices and more particularly to evanescent-wave coupling devices which may be utilized to couple signals between a diode array and a dielectric waveguide.

Presently, a great deal of interest exists in the development of integrated circuits for use at microwave, millimeter and submillimeter frequencies. For example, "Dielectric Waveguide Microwave Integrated Circuits-An Overview", by Robert M. Knox, IEEE Transactions on Microwave Theory and Techniques, Vol. MTT-24, No. 11, November 1976, presents a discussion of integrated circuit techniques for use at microwave and millimeter wavelengths using refractive-type waveguides and integrated circuit processing. The use of dielectric waveguides to transmit infrared energy has recently been developed and it is disclosed in "Polycrystaline Fiber Optical Waveguides for Infrared Transmission", by D. A. Pinnow et al, IEEE Journal of Quantum Electronics, QE-13, No. 9 (Sept. 19, 1977), page 91d, and a presently co-pending patent application entitled Millimeter Wave Transmission Line Using Thallium Bromoiodide Fiber, Ser. No. 90,233, filed Nov. 1, 1979, by Adrian E. Popa, now U.S. Pat. No. 4,293,833.

The coupling of such guided waves to microwave devices such as microwave mixer diodes, or the like, has generally been done in a number of ways. One such way is the so-called whisker contact method, wherein the end of a whisker-like wire antenna is butt-coupled to a diode in order to inject energy into or extract energy from the waveguide. Coupling to the whisker may be enhanced by means of a reflector arrangement wherein electromagnetic energy is directed at a reflector-type antenna which re-directs the electromagnetic energy onto the whisker. The diode is then utilized to down-convert the electromagnetic signal into an intermediate frequency signal utilized in a receiver system. Such a system is described in the article "High Sensitivity Sub-millimeter Heterodyne Receiver", by H. R. Fettermen et al, Proceedings of the IEEE, 1978.

Conventional microwave devices are well-known in the art, and are generally discussed in a book entitled "Microwave Semiconductor Devices and Their Circuit Applications", edited by H. A. Watson, McGraw-Hill Book Company 1969, with particular reference to chapters 8-12. Millimeter-wave integrated circuits are also discussed in a paper entitled "Millimeter-Wave IC's Spring From The Lab", by N. C. Deo et al, in Microwaves, October 1979.

However, no prior art systems have been designed which allow for the coupling of microwave energy between a dielectric waveguide and an array of diodes.

It would therefore be an improvement in the microwave art to provide for an evanescent-wave coupling device which allows coupling of microwave, millimeter or submillimeter wave energy between a dielectric waveguide and a diode array.

Also, it would be an improvement in the microwave art to provide an evanescent-wave coupler which may be employed as a harmonic generator, upconverter, mixer, signal source, detector arrangement, or power combiner, or the like.

SUMMARY OF THE INVENTION

In order to overcome the deficiencies in prior art microwave coupling devices, the present invention provides for an evanescent-wave coupling device. The coupling device comprises a dielectric waveguide having a core section and a cladding section encompasing the core section except for a portion thereof. A diode array is disposed adjacent to the waveguide near the exposed portion of the core section at a proximity which allows for evanescent coupling of energy between the waveguide and the diode array.

One end of the waveguide is utilized as an input port for coupling input signals thereto, and may have a signal source coupled thereto in certain embodiments. A diode port is coupled to the diode array which allows for the coupling of signals into or out of the diode array depending upon the embodiment. The other end of the waveguide is utilized as an output port which generally provides for coupling of output signals from the coupling device, but which may be utilized to reflect or absorb the energy in certain specific embodiments.

A plurality of microwave devices may be provided utilizing this coupling device by modifying the signals applied to the various ports of the device as explained below. For example, a signal source, detector, mixer, harmonic generator, upconverter, or power combiner may be provided depending upon the choice of signals applied to the coupler and the method of combining the signals.

The manner in which the various signals are combined in each of the embodiments is generally well-known in the microwave art. The devices which may be made utilizing the evanescent-wave coupler of the present invention correspond to existing conventional microwave devices which are designed for the same purpose. A general understanding of these devices may be obtained with reference to the publication entitled "Microwave Semiconductor Devices and Their Circuit Applications", cited above.

For example, in one embodiment, a harmonic generator device is provided wherein an input signal at a first predetermined frequency is provided by a signal source to one dielectric waveguide port, and a bias voltage (optional) may be applied to the diode array by way of the diode port. The diode array produces an output signal at a frequency which is a predetermined multiple of the first predetermined frequency. The harmonics are coupled to the other dielectric waveguide port by means of evanescent-wave coupling. The principles which form the basis for the frequency multiplication are well-known in the art, and are the same as in conventional microwave devices.

An upconverter may be provided in another embodiment when the signal source applies an input signal to one dielectric waveguide port at a first predetermined frequency and a second signal is applied to the diode port at a second predetermined frequency. The evanescent-wave coupling device combines the first and second signals in a manner which produces a third signal at the other dielectric waveguide port having a frequency which is the sum of the first and second frequencies.

A mixer, or down-converter, may be provided by combining the first and second signals provided at the two dielectric waveguide ports in a manner which produces a third signal at the diode port having a frequency which is the difference between the first and second frequencies.

A detector may be provided by allowing the signal source to provide a signal to one dielectric waveguide port which travels through the waveguide. The diode array detects the signal through the evanescent-wave coupling process and provides an output signal through the diode port.

Another embodiment may provide a signal source by applying an input bias plus modulation at the diode port. The diode array generates a signal output coupled to the dielectric waveguide by evanescent-wave coupling which may be transmitted along the waveguide or coupled to other components or devices.

The coupling between the energy travelling through the waveguide and the diode array is accomplished by means of a process commonly referred to as evanescent coupling. This type of coupling occurs in a waveguide due to the fact that the electric field associated with the energy travelling through the waveguide is not totally confined within the waveguide. In the evanescent-wave coupling device of the present invention, the cladding section is not present in the area where the diode array is disposed. Therefore, the evanescent electric fields terminate on the diode array along the exposed portion of the waveguide. Thus, energy may be coupled to, or removed from, the waveguide to the diode array.

BRIEF DESCRIPTION OF THE DRAWINGS

The features and advantages of the present invention may be more readily understood with reference to the following detailed description taken in conjunction with the accompanying drawings, wherein like reference numerals designate like structural elements, and in which:

FIG. 1b shows a perspective view of the diode array of FIG. 1a;

DETAILED DESCRIPTION OF THE INVENTION

Figure 1A:
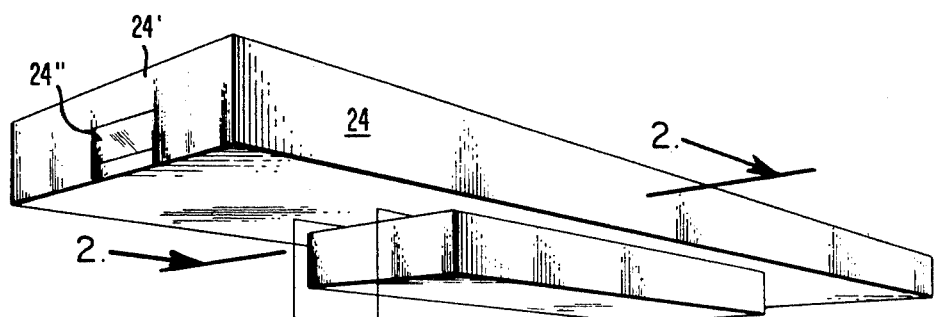
FIG. 1a shows a perspective view of an optical coupling device in accordance with the principles of the present invention.

Referring to FIGS. 1a and b, there is shown a perspective view of an evanescent-wave coupling device in accordance with the principles of the present invention. The evanescent-wave coupling device comprises a laser diode array 22 which includes a plurality of laser diodes 23, such as Schottky, Gunn or IMPATT diodes, or the like, disposed on a substrate 21. Diode control circuitry, conventionally referred to as a diode port 25, is coupled to each of the diodes 23 in a conventional manner. The electrical connections to the diode port 25 are not shown in the exposed view, but are shown clearly in FIG. 6 for one particular embodiment. The electrical coupling between the diodes 23 and the diode port is conventional and well-known in the art. The diode port 25 provides a means by which low frequency signals are coupled to or from the diodes 23. A dielectric waveguide 24 is disposed adjacent to the diode array 22. The waveguide 24 has a core section 24", and a cladding section 24' encompasing the core section, except for a portion thereof which allows the core section 24" to be exposed to the diodes 23 of the diode array 22. This is shown more clearly in FIG. 2.

Figure 1B:
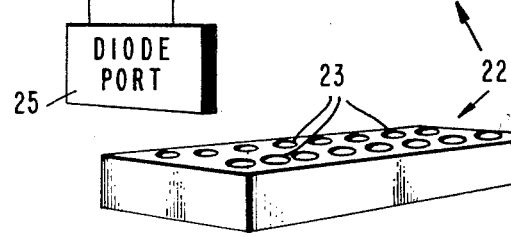
Figure 2:
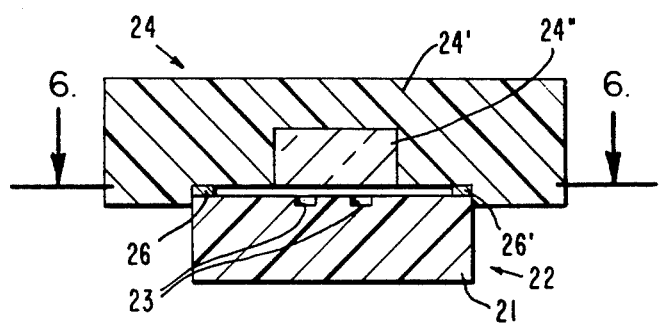
FIG. 2 shows an end view of the optical coupling device of FIG. 1 taken along lines 2—2.

FIG. 2 shows an end view of the coupling device of FIG. 1 taken along lines 2—2, which illustrates in more detail the general location and construction of the components of the device. FIG. 2 more clearly shows the core section 24" and cladding section 24' of the waveguide 24, and in particular the exposed core section 24" which is adjacent to the diode array 22. Spacers 26, 26' are provided to separate the diode array 22 from the core section 24", although these may not be required in all embodiments.

The core section 24" of the optical waveguide 24 may be comprised of a material such as thallium bromoiodide fiber, or the like. An outer covering made of plastic, or the like, may be utilized as the cladding section 24'. The diode array 22 may be comprised of a plurality of Schottky diodes disposed in a substrate comprised of a conventional semiconductor material, such as silicon or gallium arsenide, or the like. The diode port 25 is generally well-known in the microwave art, and is adapted to provide bias signals, or the like, to the diodes 23. A general understanding of the control and biasing of diodes utilized in microwave systems, or the like, may be obtained from the book entitled "Microwave Semiconductor Devices and Their Circuit Applications", cited in the background.

Figure 3:
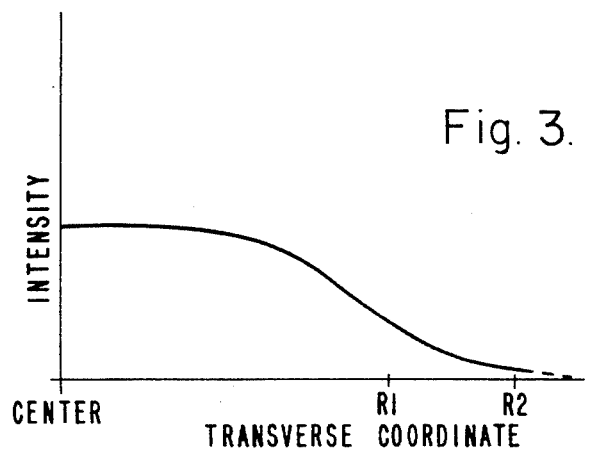
FIG. 3 shows a graph representing electric field intensity verses a transverse coordinate in a clad rectangular dielectric waveguide.

The coupling of energy between the waveguide 24 and the diode array 22 is due to the coupling of evanescent electric fields of energy traversing the waveguide 24 as the energy passes across the diode array 22. FIG. 3 shows a graph of electric field intensity verses a transverse coordinate of a clad dielectric waveguide. The position of the core/cladding interface is shown as coordinate R1 and the other surface of the cladding is shown as coordinate R2. The electric field is generally a trigonometric-like function within the core area, while in the cladding area, the field is a decaying exponential-like function. Therefore, if the cladding is removed, thus exposing the core section, a portion of the electric field extends outside the core section. Therefore, energy may be coupled between the waveguide 24 and an adjacently displosed diode 23.

Figure 4:
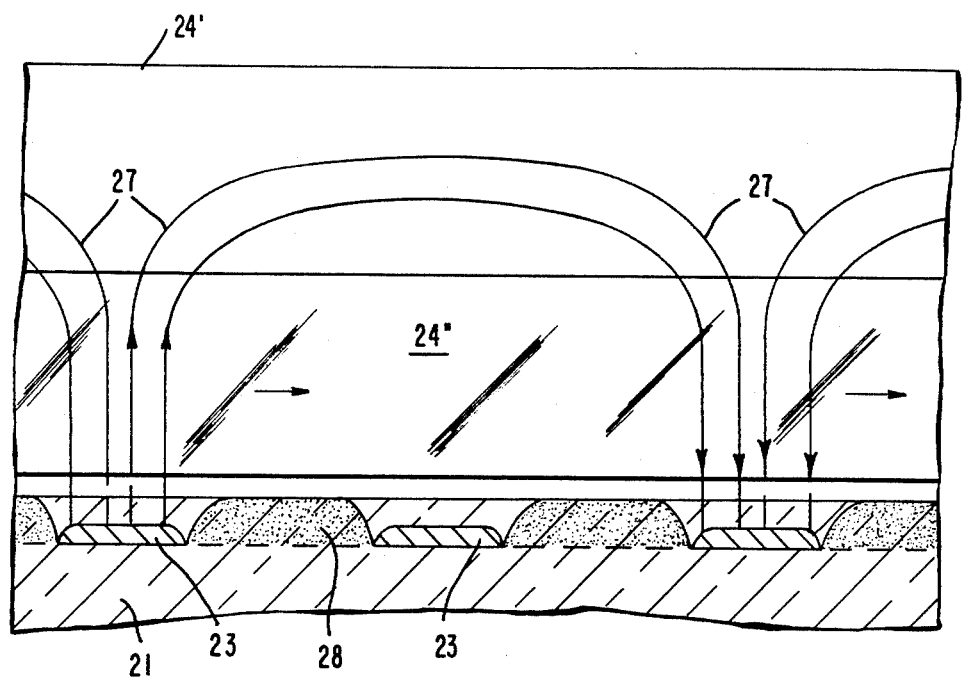
FIG. 4 illustrates a schematic representation of the $HE_{11}$ mode fields sweeping over the diode array of the coupler of FIG. 1.

Referring to FIG. 4 there is shown a schematic representation of the $HE_{11}$ mode electric fields 27 sweeping over the diodes 23 of the diode array 22. As the electric fields 27 propagate down the waveguide 24, they are radiated from the waveguide 24, and the field lines intersect with the diodes 23. Therefore, the energy traveling along the waveguide 24 may be coupled to the diodes 23. Vice-versa, the diodes 23 may also interact with energy traveling in the waveguide 24 in a manner which allows for the input of information into the energy traveling within the waveguide 24. Accordingly, various devices may be constructed employing the principles of the present invention. These devices are discussed in more detail hereinbelow.

FIG. 4 shows in more detail the construction of the diode array 22. The substrate 21 has an insulating layer 28, such as silicon dioxide, or the like, disposed thereon. This layer 28 is etched away and the diodes are, disposed in the etched areas. The design and preparation of the diode arrangements is well-known in the art. However, although pluralities of diodes have been manufactured on a single chip, it is not believed that anyone has used a plurality of individual diodes to form an array as is provided in the present invention. Common practice is to use only one of the diodes on the chip at any one time.

Figure 5:
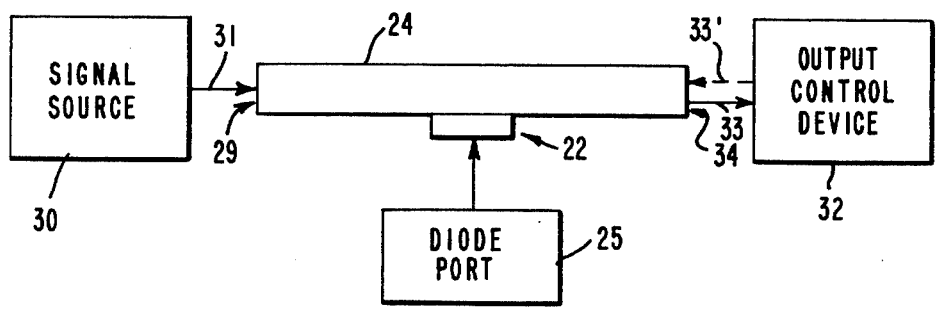
FIG. 5 shows the coupler of the present invention which further incorporates signal input and output devices coupled thereto.

FIG. 5 shows one embodiment of an evanescent-wave coupler in accordance with principles of the present invention. The waveguide 24, diode array 22, and diode port 25 are as discussed hereinabove. In addition, an input signal source 30 is disposed adjacent to one end of the waveguide, which is conventionally known as an input port 29. The signal source 30 applies an input signal 31 to the input port 29 which traverses the length of the waveguide 24. An output coupling device 32, such as an absorber or reflector, is provided which generally assists in coupling energy out of the waveguide 24. An output signal 33 exits the coupler from the end opposite to the input port 29, commonly referred to as an output port 34. As will be more fully described below, the output coupling device 32 may be an absorbing device which absorbs the output signal 33. The device 32 may also be a reflecting device which reflects the output signal 33 back into the waveguide 24, generally shown as reflected signal 33'.

FIG. 5 may be employed to illustrate various devices which may be constructed utilizing the principles of the present invention. Table 1 below indicates some of the devices which may be constructed along with the signals provided by or at the input port 29, output port 34, and diode port 25. The amplitudes and frequencies of the signals employed, and the general methods of applying these signals to the various devices described are analogous to arrangements constructed and used in conventional microwave devices. Such devices are discussed in the book written by Watson referenced in the backgound of the specification.

TABLE 1

| | Input and Output Signals | | |
|---|---|---|---|
| Device | Input Port 29 | Diode Port 25 | Output Port 34 |
| Harmonic Generator | $F_1$ | DC(bias) | $nF_1$, (n = 2, 3, ...) |
| Upconverter | $F_1, F_2$ | — | $F_1 + F_2$ |
| | $F_1$ | $F_2$ | $F_1 + F_2$ |
| Mixer | $F_1, F_2$ | $F_1 - F_2$ | — |
| | $F_1, F_2$ | — | $F_1 - F_2$ |
| | $F_1$ | $F_2$ | $F_1 - F_2$ |
| Detector | $F_1$ | DC(output) | — |
| Signal Source | — | DC(input) | $F_1$ |

As is shown in Table 1, the present invention may be employed as a harmonic generator when the input signal source 30 provides an input signal 31 to the input port 29 at a first predetermined frequency ($F_1$) and the diode port 25 controls the diode array 22 so as to provide proper bias for the diode array 22 (for example, a square-law characteristic). The output signal 33 is an integral multiple, or harmonic, of the first predetermined frequency of the input signal 31.

An upconverter is provided when the input signal source 30 provides an input signal 31 at a first predetermined frequency ($F_1$) and the diode port 25 provides a signal at a second predetermined frequency ($F_2$) which is combined in a manner which produces the sum of the two signals as the output signal 33. Alternatively, the two signals may be combined in the waveguide 24. A mixer, or downconverter, is provided when the first and second signals are subtracted in the device to provide an output signal 33 which are the difference between the first and second signals. The choice of input and output ports for the three frequencies depends on the actual magnitude of $F_2 - F_1$.

In the detector embodiment, the input signal 31 traverses along the waveguide 24 and is either absorbed in the diode array 22 in a single pass, or is reflected to enhance the absorption by the detector array 22. The diode array 22, such as an array of Schottky diodes, acts as a detector arrangement wherein it samples the energy traversing the waveguide 24 by means of the evanescent-wave coupling process and provides an output signal through the diode port 25. In a signal source embodiment, the diode array 22 may be comprised of oscillating-type diodes, such as Gunn or IMPATT diodes, which provide an input signal to the waveguide 24. The output signal 33 is provided at the output port 34.

Figure 6:
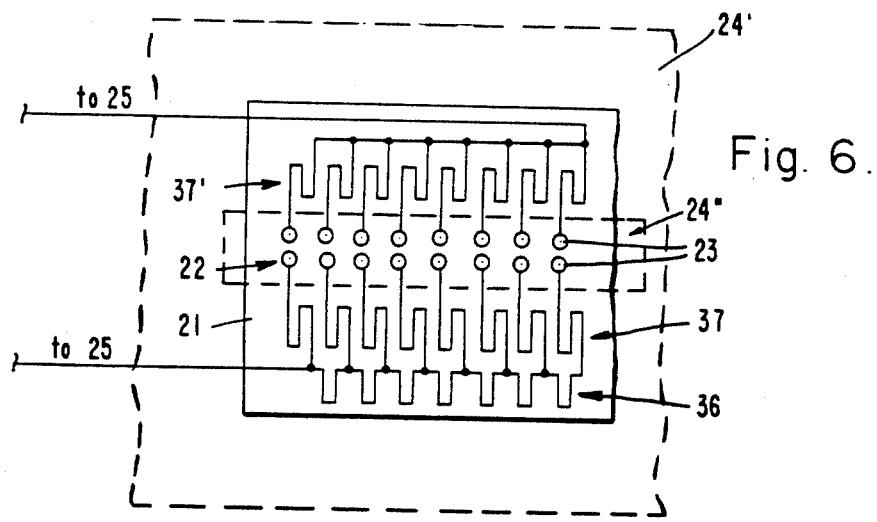
FIG. 6 shows a top view of an embodiment of the coupler of the present invention which may be utilized as a mixer, upconverter or downconverter.

Referring to FIG. 6, there is shown an an embodiment of the evanescent-wave coupler of the present invention which may be employed as a mixer, upconverter or downconverter. This embodiment includes, in addition to the diode array 22 and waveguide 24, a plurality of chokes 37, 37' individually coupled to the plurality of diodes 23. Also, a delay line 36 is coupled to one set of chokes 37. The delay line 36 is provided to phase match signals provided to the diodes 23. In the mixer of FIG. 6, low-frequency energy is provide from the diode port 25 through the chokes 37, 37' and delay line 36 to the diode array 22. Energy traversing the waveguide 24 interacts with the low-frequency energy to produce an output signal which is the difference between the frequency of the energy traveling along the waveguide and the low-frequency signal.

Figure 7:
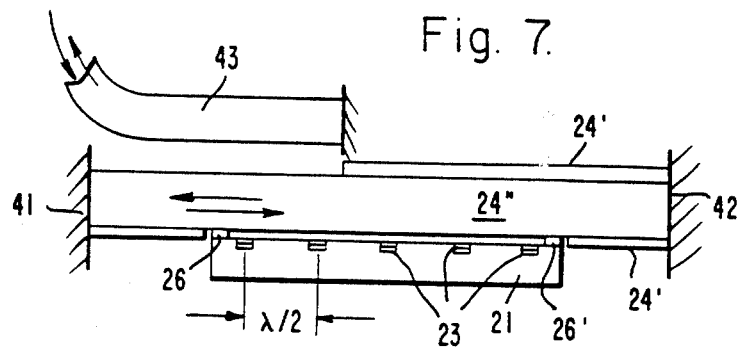
FIG. 7 illustrates another embodiment of the present invention which employs a resonant cavity in order to enhance the coupling of energy between the waveguide and diode array.

Referring to FIG. 7 there is shown an embodiment of the present invention which may be utilized as a power combiner. Shown therein is a waveguide 24 generally constructed as presented hereinabove but which is disposed between two shorting planes 41, 42. The shorting planes 41, 42 act as reflectors which set up standing waves in the waveguide 24. The diode array 22 is constructed such that the diodes 23 are spaced a distance of one-half of a wavelength apart, based on the particular wavelength of energy traversing the waveguide 24. An evanescent-wave directional coupler 43 is employed to couple energy to and from the power combining waveguide 24 to the output port 32 using conventional means such as a circulator.

Figures 8A, 8B:
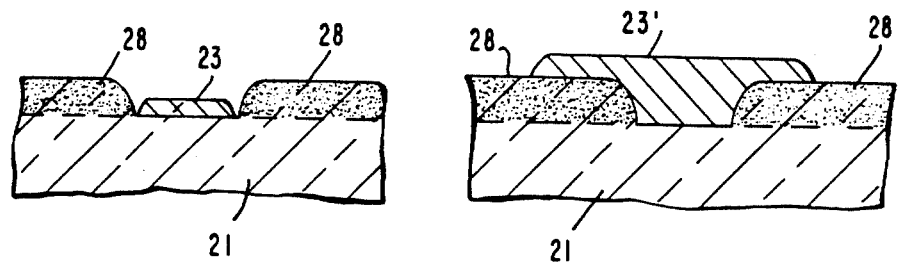
FIGS. 8a and 8b illustrate a method by which to increase the coupling capacitance of the diode array which may be utilized with the present invention.

Referring to FIG. 8, there is shown a conventional diode arrangement 23 in FIG. 8a and a modified diode arrangement 23' in FIG. 8b. The modified diode arrangement 23' may be employed to increase the area of the diode in order to increase coupling capacitance of the diode array 22. The diodes 23, 23' are comprised of metal, or the like, separated by insulators 28, comprised of silicon dioxide, or the like. As mentioned above, the substrate 21 may be comprised of silicon or gallium arsenide, or the like. Such a construction allows for enhanced coupling between the waveguide 24 and the diodes 23 utilized in the present invention. This type of electrode design is discussed in a publication entitled "Review of Submillimeter Wave Mixers" by M. McColl, Proceedings of the SPIE, Vol. 105 (1977), at page 24.

Thus, there has been described a new and improved dielectric waveguide coupler which may be employed for use in the microwave, millimeter or submillimeter wavelength ranges to provide a variety of useful devices. Such devices include a signal source, detector, harmonic generator, upconverter, mixer, and power combiner. The problems existing in the prior art related to coupling of microwave energy to and from diodes have been eliminated. The evanescent-wave nature of the device provides for devices which are less complicated to manufacture than conventional microwave hardware.

It is to be understood that the above-described embodiments are merely illustrative of some of the many specific embodiments which represent applications and principles of the present invention. Clearly, numerous and varied other arrangements may be readily devised by those skilled in the art without departing from the spirit and scope of the invention.

What is claimed is:

1. An evanescent-wave coupling device comprising:
   a dielectric waveguide having a core section and a cladding section encompassing said core section except for a portion thereof, said waveguide having an input end and an output end;
   a diode array disposed adjacent to said waveguide near the exposed portion of said core section at a proximity which allows for evanescent coupling of energy between said waveguide and said diode array;
   first means coupled to the input end of said waveguide for coupling first signals thereto;
   diode control means coupled to said diode array for coupling second signals to or from said diode array, said diode control means comprising a choke and delay-line arrangement to phase match the diode signals, which arrangement is coupled to said diode array and which allows said diode control means to apply a low frequency signal to said diode array; and
   second means coupled to the output end of said waveguide for coupling third signals into or out of said waveguide.

2. The evanescent-wave coupling device of claim 1 wherein said first means comprises a signal source which provides said first signals at a first predetermined frequency, said diode control means providing second signals at a second predetermined frequency, said evanescent-wave coupling device combining said first and second signals in a manner which produces third signals having a frequency which is a predetermined multiple of said first predetermined frequency, said third signals providing harmonic output signals for said device, said device comprising a harmonic generator device.

3. The evanescent-wave coupling device of claim 1 wherein said first means comprises a signal source which provides said first signals at a first predetermined frequency, said diode control means providing second signals at a second predetermined frequency, said coupling device combining said first and second signals in a manner which produces third signals having a frequency which is the sum of said first and second frequencies, said device comprising an upconverter device.

4. The evanescent-wave coupling device of claim 1 wherein said first means comprises a signal source which provides said first signals at a first predetermined frequency, said diode control means providing second signals at a second predetermined frequency, said second signals being local oscillator signals, said evanescent-wave coupling device combining said first and second signals in a manner which produces third signals having a frequency which is the difference between said first and second frequencies, said device comprising a mixer device.

5. The evanescent-wave coupling device of claim 1 wherein said first means comprises a signal source which provides said first signals at a first predetermined frequency, said coupling device coupling said first signals to said diode array which detects said first signals in a predetermined manner which allows said diode control means to couple second signals out of said device as the output signals thereof, said second signals being indicative of information carried by said first signals.

6. The evanescent-wave coupling device of claim 1 which further comprises a plurality of shorting planes coupled to opposite ends of said dielectric waveguide in order to form a dielectric waveguide resonator; and
   a directional coupler disposed adjacent to said waveguide resonator for coupling energy applied to said directional coupler into or out of said dielectric waveguide resonator.

* * * * *